(12) United States Patent
Saitoh

(10) Patent No.: US 9,231,081 B2
(45) Date of Patent: Jan. 5, 2016

(54) METHOD OF MANUFACTURING A SEMICONDUCTOR DEVICE

(71) Applicant: Seiko Instruments Inc., Chiba (JP)

(72) Inventor: Naoto Saitoh, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 13/779,860

(22) Filed: Feb. 28, 2013

(65) Prior Publication Data
US 2013/0244385 A1    Sep. 19, 2013

(30) Foreign Application Priority Data
Mar. 9, 2012    (JP) .............................. 2012-053555

(51) Int. Cl.
| | |
|---|---|
| H01L 21/76 | (2006.01) |
| H01L 29/66 | (2006.01) |
| H01L 29/417 | (2006.01) |
| H01L 29/78 | (2006.01) |
| H01L 29/06 | (2006.01) |
| H01L 29/10 | (2006.01) |

(52) U.S. Cl.
CPC ...... *H01L 29/66666* (2013.01); *H01L 29/0657* (2013.01); *H01L 29/1095* (2013.01); *H01L 29/41741* (2013.01); *H01L 29/41766* (2013.01); *H01L 29/66727* (2013.01); *H01L 29/66734* (2013.01); *H01L 29/7809* (2013.01); *H01L 29/7813* (2013.01)

(58) Field of Classification Search
USPC .......... 438/239, 270, 361; 257/330, 336, 503, 257/549, E21.21, E21.63, E21.013
See application file for complete search history.

(56) References Cited

U.S. PATENT DOCUMENTS

| | | | | |
|---|---|---|---|---|
| 2002/0110977 | A1* | 8/2002 | Nakamura | 438/239 |
| 2005/0039673 | A1* | 2/2005 | Ishida | 117/90 |
| 2009/0212375 | A1* | 8/2009 | Risaki et al. | 257/408 |
| 2012/0049274 | A1* | 3/2012 | Elattari et al. | 257/330 |

FOREIGN PATENT DOCUMENTS

JP    2002050760    2/2002

* cited by examiner

*Primary Examiner* — Charles Garber
*Assistant Examiner* — Abdulfattah Mustapha
(74) *Attorney, Agent, or Firm* — Adams & Wilks

(57) ABSTRACT

In a method of manufacturing a semiconductor device, a body region is formed in an epitaxial layer provided on a semiconductor substrate. A part of a semiconductor material forming the body region surface is removed to form a convex-type contact region protruding from the body region surface and to form a shallow trench surrounding the convex-type contact region. A deep trench region is formed so as to extend from the shallow trench surface to inside of the epitaxial layer. A gate insulating film is formed on an inner wall of the deep trench region which is filled with polycrystalline silicon that is held in contact with the gate insulating film. A source region and a body contact region are formed in the shallow trench and the convex-type contact region, respectively, and a silicide layer is formed to connect the source region and the body contact region to each other.

17 Claims, 5 Drawing Sheets

METHOD OF MANUFACTURING A SEMICONDUCTOR DEVICE

BACKGROUND OF THE INVENTION

1. Field of the Invention

The present invention relates to a semiconductor device and a method of manufacturing the semiconductor device. For example, the present invention relates to a structure of a trench MOSFET to be formed on the same substrate as a CMOS and a method of manufacturing the trench MOSFET.

2. Description of the Related Art

MOS transistors are electronic elements playing a central role in electronics. Reducing the size of the MOS transistors and improving the drive performance thereof have been important challenges regardless in a low breakdown voltage region or in a high breakdown voltage region.

A vertical trench MOSFET is often used for applications that require high drive performance since a transistor having a large channel width in a small area can be formed with a trench MOSFET having a vertical structure, in which the movement direction of carriers is set up or down (in a vertical direction) with respect to a semiconductor substrate surface. Trench MOSFETs have been widely used so far as discrete driver elements, but in recent years, there has been proposed a process of integrating the trench MOSFET having high drive performance with a general CMOS transistor forming a control circuit.

The surface shape of the trench MOSFET can be divided into a trench region and a non-trench region when viewed from above. Further, the non-trench region can be divided into a source region as a high concentration impurity region, and a body contact region as a high concentration impurity region for fixing the potential of a body region.

Further, the source region and the body contact region as the non-trench region are generally used at the same potential, and hence both of the impurity regions are arranged adjacent to each other, and are simultaneously connected by the same metal wiring in many cases. In a case of a silicide formation process, both the regions are covered with a continuous silicide, and are connected to a wiring metal in a minimum contact area and number.

In order to improve the drive performance per unit area, it is required to reduce the area of the trench region or the non-trench region. The body contact region, which is a part of the non-trench region, is only required to have a fixed potential. Considering this point, it is effective to set the area of the body contact region small. However, when the potential is unstable, snapback phenomenon occurs in the transistor, which hinders normal operation at a desired operation voltage.

Further, the body contact region is affected by the fluctuations in concentrations of impurities forming the source region and diffusion fluctuations, and hence the body contact region needs to be arranged in an area with more margins. Accordingly, the area cannot be easily reduced.

Conventionally, the source region and the body contact region have been formed by controlling an impurity concentration and heat treatment so that the area can be reduced as much as possible while fixing the potential. Alternatively, as described in Japanese Patent Application Laid-open No. 2002-50760, there has been proposed an idea of providing a position at which the body contact region is arranged and a position at which the body contact region is absent so that the area is reduced as a whole.

In the technology of Japanese Patent Application Laid-open No. 2002-50760, as illustrated in FIG. 5, a trench region 51 and a non-trench region 53 are arranged in a stripe state, and the non-trench region 53 is provided in two types of widths. A body contact region 52 is arranged in a wider part of the non-trench region 53, and the body contact region 52 is not arranged in a narrower part of the non-trench region 53. The adjacent stripes with this arrangement are arrayed in a staggered manner. Thus, the area efficiency is optimized to form the transistor in a minimum area. In this manner, it is intended to reduce the ON resistance of the transistor per unit area.

However, even with the technology of Japanese Patent Application Laid-open No. 2002-50760, the body contact region is required to be arranged in a certain area or more, and this region still restricts the reduction of the transistor area. Further, when the trench regions are arranged in a grid manner, the layout thereof is limited to a stripe state. Further, it cannot be said that the measure of arranging the body contact regions in places is the best method in terms of obtaining uniform transistor characteristics.

SUMMARY OF THE INVENTION

In view of the above, the present invention has an object to realize a manufacturing method capable of obtaining a uniform trench MOSFET in a small element area through use of a process having good controllability without increasing steps.

In order to achieve the above-mentioned object, according to a first exemplary embodiment of the present invention, there is provided a method of manufacturing a semiconductor device, including: forming, on a semiconductor substrate of a first conductivity type, a buried layer of a second conductivity type; forming an epitaxial layer of the second conductivity type on the buried layer; forming a body region of the first conductivity type at a certain depth from a surface of the epitaxial layer of the second conductivity type; removing a semiconductor material forming a surface of the body region, thereby forming a shallow trench around a convex-type contact region; forming a deep trench region extending from a part of a surface of the shallow trench to inside of the epitaxial layer of the second conductivity type; forming a gate insulating film on an inner wall of the deep trench region; filling the deep trench region with polycrystalline silicon so that the polycrystalline silicon is held in contact with the gate insulating film; forming a source region of the second conductivity type in the shallow trench in the surface of the body region; forming a body contact region of the first conductivity type in the convex-type contact region on the surface of the body region; and forming a silicide layer for connecting the source region and the body contact region to each other, in which the body contact region comprises an entire surface of the convex-type contact region, and the entire surface and a surface of the source region are covered with the silicide layer.

Further, according to a second exemplary embodiment of the present invention, there is provided a method of manufacturing a semiconductor device, including: forming, on a semiconductor substrate of a first conductivity type, a buried layer of a second conductivity type; forming an epitaxial layer of the second conductivity type on the buried layer; forming a shallow trench in a specific region in a surface of the epitaxial layer, thereby forming a concave-type contact region; forming a body region of the first conductivity type, the body region being formed shallow below a flat region in which the concave-type contact region is absent and being formed deep so as to protrude toward the buried layer below the concave-type contact region so that distances from the surface of the epitaxial layer are constant; forming a deep trench region extending from a surface of the body region to inside of the epitaxial layer in the flat region; forming a gate insulating film on an inner wall of the deep trench region; filling the deep trench region with polycrystalline silicon so that the polycrystalline silicon is held in contact with the gate insulating film; forming a source region of the second conductivity type in the flat region on the surface of the body region; forming a body contact region of the first conductivity type along the concave-type contact region on the surface of the body region; and forming a silicide layer for connecting the source region and the body contact region to each other, in which the body contact region comprises an entire surface of the concave-type contact region, and the entire surface and a surface of the source region are covered with the silicide layer.

According to the present invention, it is possible to manufacture a semiconductor device which can maximize the element characteristics and can meet fine dimensions. As a result, the cost thereof can be reduced.

DETAILED DESCRIPTION OF THE PREFERRED EMBODIMENTS

Figure 1A:
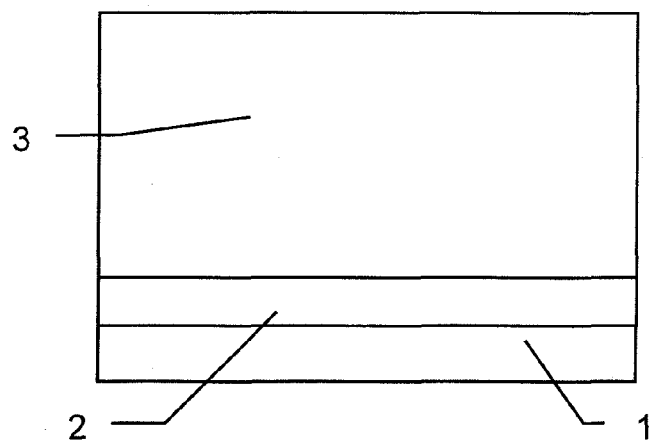
FIGS. 1A to 1C are sectional views illustrating, in the process order, a method of manufacturing a semiconductor device according to a first embodiment of the present invention.
Figure 1B:
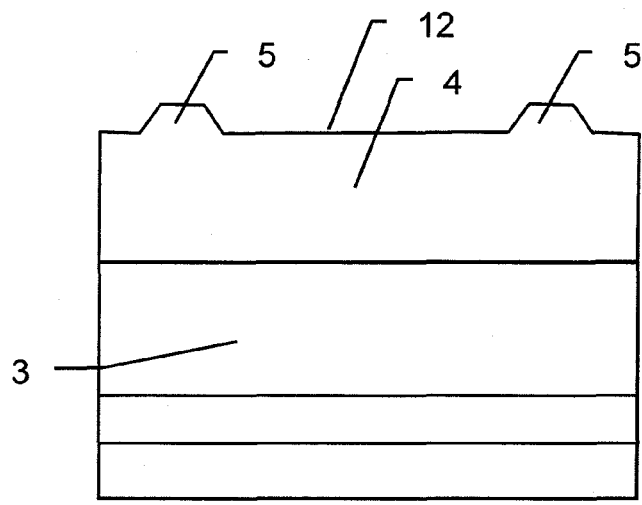
Figure 1C:
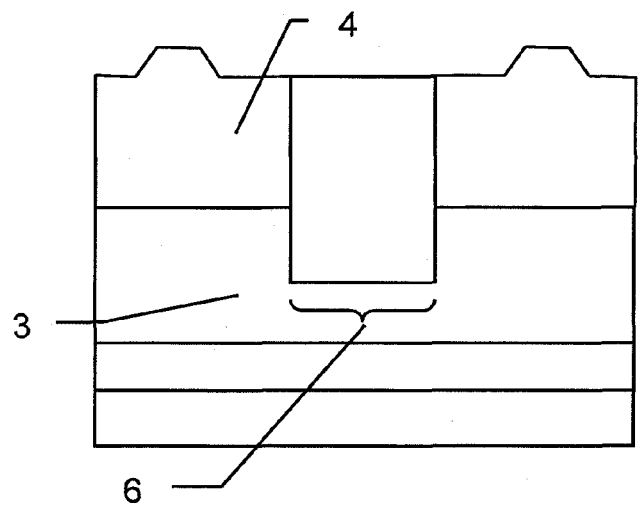

FIGS. 1A to 1C are views illustrating a method of manufacturing a semiconductor device according to a first embodiment of the present invention, and are sectional views of a trench MOSFET of the present invention in the process order.

As illustrated in FIG. 1A, an epitaxial layer 3 (which is called "N-epi layer 3" herein) is provided on an N-type buried layer 2 formed on a P-type semiconductor substrate 1, and is entirely doped with N-type impurities. The N-type buried layer 2 has a concentration of $5\times10^{17}/cm^3$ to $5\times10^{19}/cm^3$, and serves as a drain region of the trench MOSFET. The N-type buried layer 2 is formed by being doped with antimony (Sb), arsenic (As), or phosphorus (P). Further, the N-epi layer 3 serves as a low concentration drain region or drift region, and is realized by being doped with phosphorus to have a concentration of $1\times10^{15}/cm^3$ to $5\times10^{17}/cm^3$. The thickness of the N-type buried layer 2 is about 2 μm to 10 μm, and the thickness of the N-epi layer 3 is 2 μm to 10 μm.

Next, as illustrated in FIG. 1B, through use of shallow trench isolation (STI) or local oxidation of silicon (LOCOS) (not shown) for element isolation in the N-epi layer 3, a semiconductor material on the surface is removed while leaving a part thereof, to thereby form a convex-type contact region 5. Accordingly, a shallow trench 12 is formed around the convex-type contact region 5, and the surface of the shallow trench 12 is lower than the surface of the convex-type contact region 5. When STI is used for element isolation, a position other than the convex-type contact region 5 is subjected to silicon etching for STI formation, thereby forming a shape as illustrated in FIG. 1B. In a CMOS formation region, a step of filling the STI with an insulating film is performed at this stage. On the other hand, when LOCOS is used for element isolation, also in a position other than the convex-type contact region 5, a LOCOS oxide film of 50 nm to 150 nm is formed, and then a part of the LOCOS oxide film is removed, to thereby form the convex-type contact region 5 illustrated in FIG. 1B.

Next, a P-type body region 4 is formed by ion implantation. The P-type body region 4 is formed by implantation of boron (B) or boron difluoride ($BF_2$) so as to have a concentration of $5\times10^{16}/cm^3$ to $1\times10^{18}/cm^3$. The implantation acceleration energy at this time is changed depending on the breakdown voltage necessary for the trench MOSFET, but is preferred to be within the range of 50 keV to 250 keV. Note that, the step of forming the P-type body region 4 may be carried out before forming the convex-type contact region 5.

Next, as illustrated in FIG. 1C, a deep trench 6 is formed in the shallow trench by etching. The depth of the deep trench 6 is about 1 μm to 3 μm, and is appropriately set based on the desired drain breakdown voltage required for the transistor.

Figure 2A:
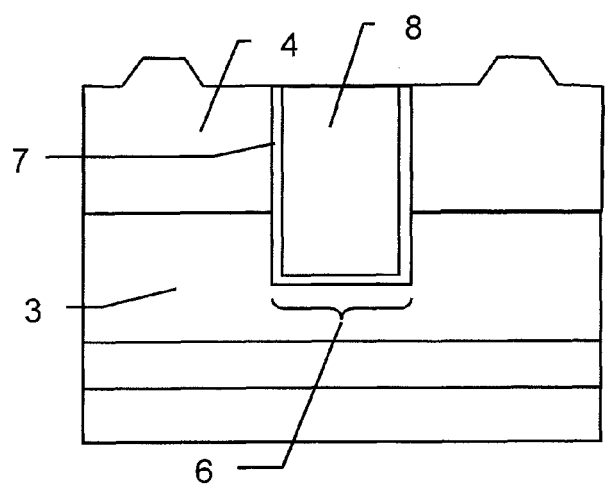
FIGS. 2A to 2C are sectional views illustrating, in the process order following FIG. 1C, the method of manufacturing a semiconductor device according to the first embodiment of the present invention.

Next, as illustrated in FIG. 2A, a gate oxide film 7 is formed on the inner wall of the deep trench 6 by thermal oxidation, and the trench 6 is filled with polycrystalline silicon that becomes a gate electrode 8 through intermediation of the gate oxide film 7. The gate electrode 8 is electrically separated from the N-epi layer 3 and the P-type body region 4 by the gate oxide film 7 extending along the side wall and the bottom surface of the deep trench 6. The thickness of the gate oxide film 7 is set in consideration of the desired gate breakdown voltage of the transistor, which is about 7 nm to 20 nm. Further, the formation temperature of the gate oxide film 7 is in the range of 800° C. to 1,150° C., and more preferably in the range of 1,000° C. to 1,150° C.

Figure 2B:
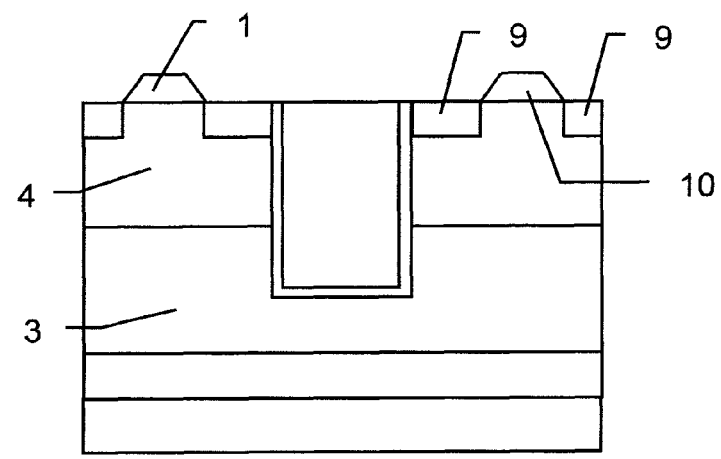

Next, as illustrated in FIG. 2B, in the upper surface region of the P-type body region 4, ion implantation for forming a source region 9 as an N-type high concentration impurity region is performed. In order to form the N-type source region 9, for example, ion implantation of As is performed preferably at a dose of $5\times10^{14}$ atoms/$cm^2$ to $1\times10^{16}$ atoms/$cm^2$ so as to reduce the sheet resistance. As a matter of course, implantation of phosphorus (P) at high concentration may be alternatively performed, or both of As and P may be introduced. Further, in a region including the convex-type contact region 5, ion implantation for forming a P-type body contact region 10 is performed. In order to form the P-type body contact region 10, for example, ion implantation of $BF_2$ is performed preferably at a dose of $5\times10^{14}$ atoms/$cm^2$ to $1\times10^{16}$ atoms/$cm^2$ so as to reduce the sheet resistance. As a matter of course, implantation of boron (B) at high concentration may be alternatively performed, or both of $BF_2$ and B may be introduced.

Figure 2C:
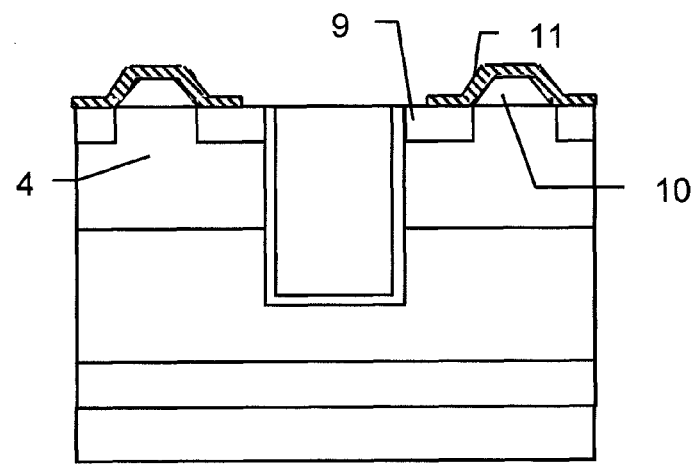

After that, as illustrated in FIG. 2C, a silicide layer 11 is formed on the source region 9 and the body contact region 10, and plug wiring (not shown) is used so that the silicide layer 11 is connected to a wiring metal layer (not shown).

In the above description, the case where the N-epi layer 3 is used is described, but a P-epi layer may be used to perform ion implantation of N-type impurities simultaneously with that to the P-type body region 4, and a region between the N-type buried layer 2 and the P-type body region 4 may be set as an N-type drain region. Further, description is made herein on the premise of an N-type transistor, but the present invention is similarly applicable also in a case of a P-type transistor having a buried layer and an epi layer of a P-type, and a body region of an N-type. (As a matter of course, an epi layer of an N-type may be used, and by impurity introduction, a region between the P-type buried layer and the body region may be set as a P-type drain region.)

Further, no description is given in detail about a CMOS to be formed on the same substrate as the trench MOSFET, but the above-mentioned steps do not include steps that interfere with the formation of the CMOS, and it is easy to form the trench MOSFET and the CMOS on the same substrate.

Figure 3A:
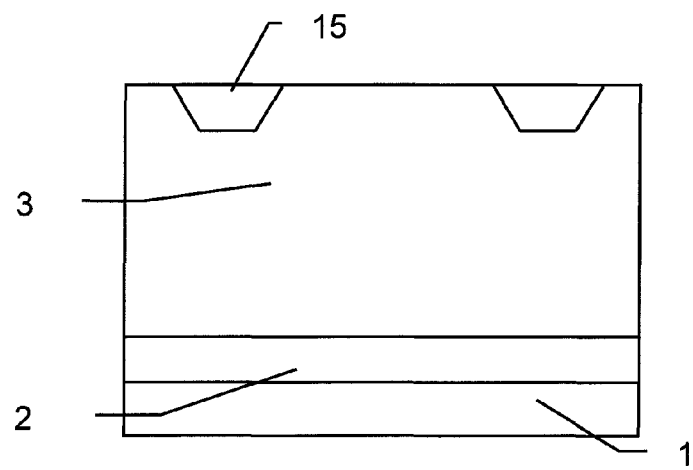
FIGS. 3A to 3C are sectional views illustrating, in the process order, a method of manufacturing a semiconductor device according to a second embodiment of the present invention.
Figure 3B:
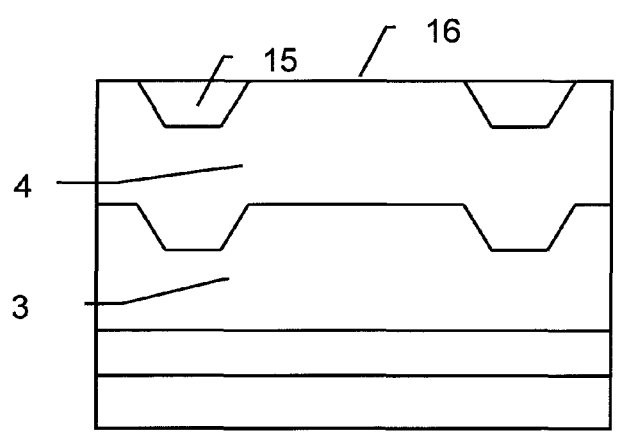
Figure 3C:
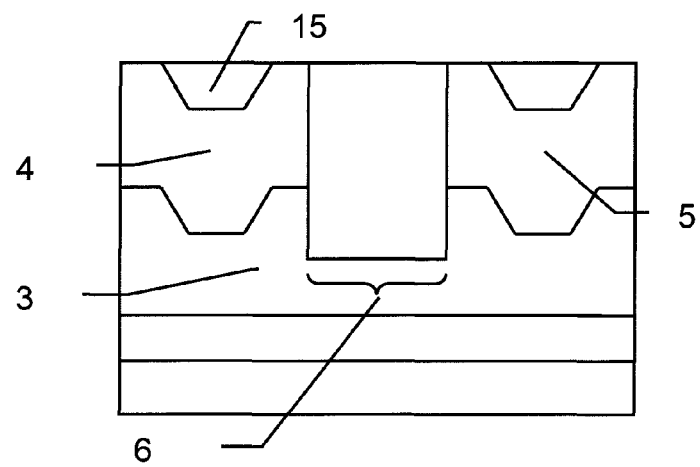

FIGS. 3A to 3C are views illustrating a method of manufacturing a semiconductor device according to a second embodiment of the present invention.

In FIG. 3A, an epi layer 3 (which is called "N-epi layer 3" herein) is provided on an N-type buried layer 2 formed on a P-type semiconductor substrate 1, and is entirely doped with N-type impurities. The N-type buried layer 2 is formed by being doped with antimony (Sb), arsenic (As), or phosphorus (P), and has a concentration of $5 \times 10^{17}/cm^3$ to $5 \times 10^{19}/cm^3$. Further, the N-epi layer 3 is realized by being doped with phosphorus to have a concentration of $1 \times 10^{15}/cm^3$ to $5 \times 10^{17}/cm^3$. The thickness of the N-type buried layer 2 is about 2 μm to 10 μm, and the thickness of the N-epi layer 3 is 2 μm to 10 μm.

Next, the N-epi layer 3 is subjected to silicon etching to arrange an STI for element isolation, thereby forming a shallow trench. The shallow trench is filled with an insulating film, but the insulating film filling the shallow trench in the region in which the trench MOSFET is to be formed is removed. (This removal of the insulating film may be performed after a resist pattern for ion implantation to the P-type body region is formed afterwards.) With this, a concave-type contact region 15 using the shallow trench is formed. Note that, the depth of the shallow trench is appropriately set based on a required operation voltage, and is about 200 nm to 600 nm.

It is also possible to form a shape similar to that of the above-mentioned concave-type contact region 15 through use of LOCOS instead of STI for element isolation. In this case, a LOCOS oxide film of 50 nm to 150 nm is formed only in the part of the concave-type contact region 15, and then a part of the LOCOS oxide film is removed by etching afterwards. In this manner, the concave-type contact region 15 having a shape similar to the case of STI can be formed.

Next, as illustrated in FIG. 3B, a P-type body region 4 is formed by ion implantation. The P-type body region 4 is formed by implantation of boron (B) or boron difluoride (BF$_2$) so as to have a concentration of $5 \times 10^{16}/cm^3$ to $1 \times 10^{18}/cm^3$. At this time, in both the region in which the concave-type contact region 15 using the shallow trench is formed and a flat region 16 in which the concave-type contact region 15 is not formed, the distance of impurity arrival from the surface is the same, and hence the impurities forming the body region 4 are distributed so as to reflect the surface shape of the N-epi layer 3. Accordingly, the bottom of the P-type body region 4 can be formed at a deep position directly below the concave-type contact region 15, and the bottom of the P-type body region 4 can be formed at a shallow position in other regions.

Next, as illustrated in FIG. 3C, a deep trench 6 is formed from the surface of the body region 4 to the N-epi layer 3. The depth of the deep trench 6 is about 1 μm to 3 μm, and is appropriately set based on the desired drain breakdown voltage required for the transistor. Note that, it is important to set the deep trench 6 in the region where the bottom of the P-type body region 4 is formed at a shallow position.

Figure 4A:
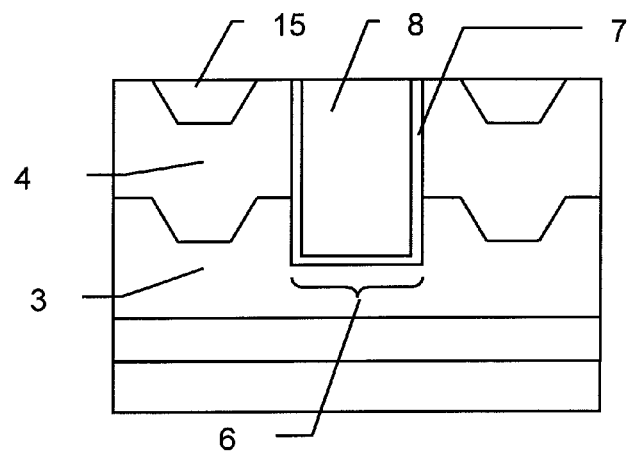
FIGS. 4A to 4C are sectional views illustrating, in the process order following FIG. 3C, the method of manufacturing a semiconductor device according to the second embodiment of the present invention.

Next, as illustrated in FIG. 4A, a gate oxide film 7 is formed on the inner wall of the deep trench 6 by thermal oxidation, and the trench 6 is filled with polycrystalline silicon that becomes a gate electrode 8 through intermediation of the gate oxide film 7. The gate electrode 8 is electrically separated from the N-epi layer 3 and the P-type body region 4 by the gate oxide film 7 extending along the side wall and the bottom surface of the deep trench 6. The thickness of the gate oxide film 7 is set in consideration of the desired gate breakdown voltage of the transistor, which is about 7 nm to 20 nm. Further, the formation temperature of the gate oxide film 7 is in the range of 800° C. to 1,150° C., and more preferably in the range of 1,000° C. to 1,150° C.

Figure 4B:
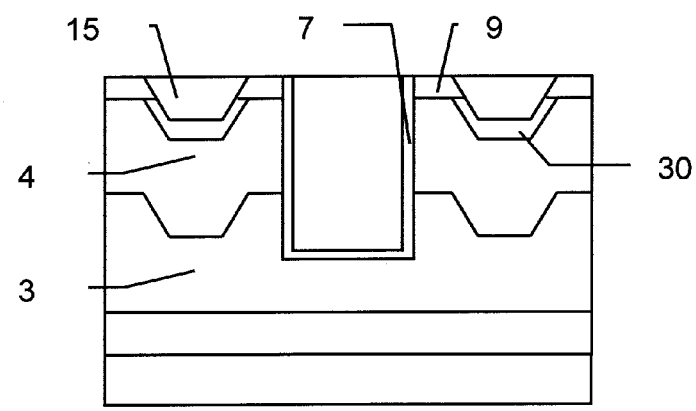

Next, as illustrated in FIG. 4B, in the upper surface of the P-type body region 4 and in a region including the concave-type contact region 15 adjacent to the side wall of the deep trench 6, a P-type body contact region 30 is formed. Further, an N-type source region 9 is formed so as to be adjacent to the deep trench 6 and adjacent to the P-type body contact region 30.

Figure 4C:
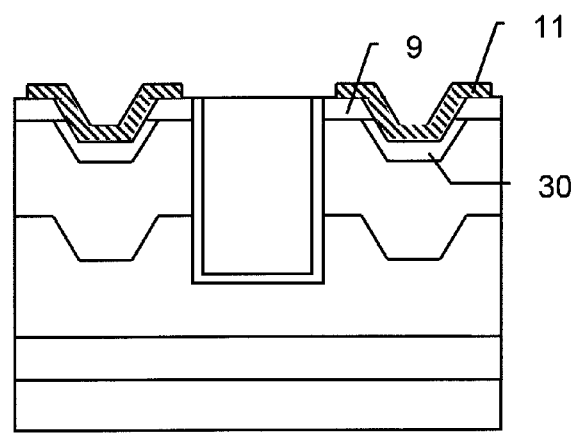
Figure 5:
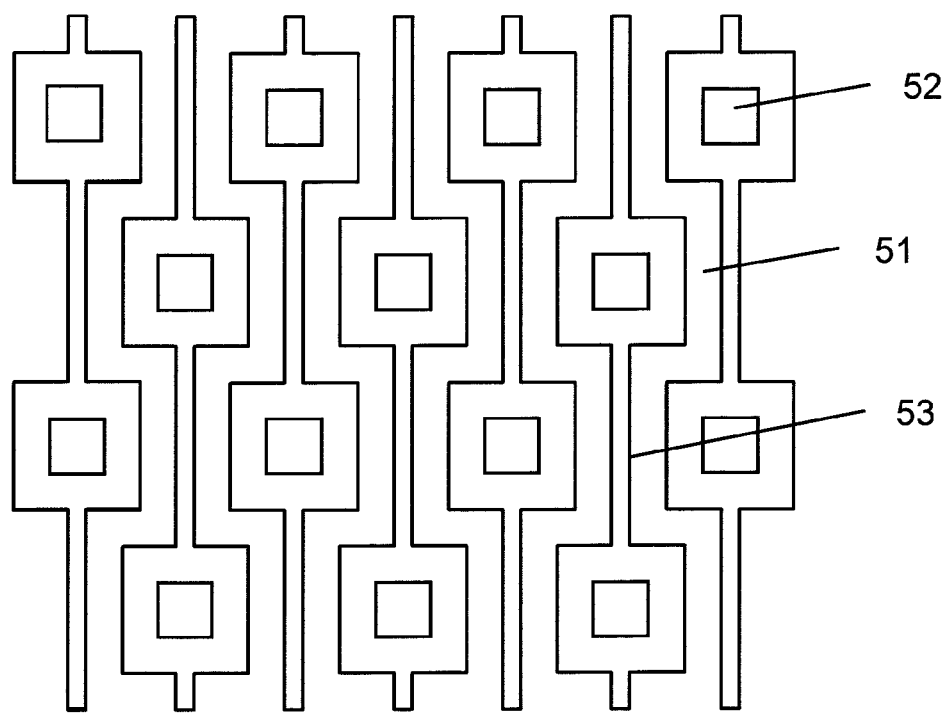
FIG. 5 is a view illustrating a conventional semiconductor device.

After that, as illustrated in FIG. 4C, a silicide layer 11 is formed on the source region 9 as the N-type high concentration impurity region and the P-type body contact region 30, and plug wiring (not shown) is used so that the silicide layer 11 is connected to a wiring metal layer (not shown).

In the above description, the case where the N-epi layer 3 is used is described, but a P-epi layer may be used to perform ion implantation of N-type impurities simultaneously with that to the P-type body region 4, and a region between the N-type buried layer 2 and the P-type body region 4 may be set as an N-type drain region. Further, description is made herein on the premise of an N-type transistor, but the present invention is similarly applicable also in a case of a P-type transistor having a buried layer and an epi layer of a P-type, and a body region of an N-type. (As a matter of course, an epi layer of an N-type may be used, and by impurity introduction, a region between the P-type buried layer and the body region may be set as a P-type drain region.)

Further, no description is given at all about a CMOS to be formed on the same substrate as the trench MOSFET, but the above-mentioned steps do not include steps that interfere with the formation of the CMOS, and it is easy to form the trench MOSFET and the CMOS on the same substrate.

With the embodiments described above, the following effects may be obtained.

(1) In the same contact area, a size of a planar body contact region corresponding to the substantive area of the body contact region can be reduced since it is possible to increase the contact area between the silicide layer and a silicon high concentration region for providing potentials to the body, and hence a trench MOSFET having a lower ON resistance can be formed in the same area.

(2) Through use of a stable process such as STI and LOCOS process, it is possible to manufacture a device having advanced characteristics while minimizing fluctuations.

The present invention is applicable to a semiconductor device used in an automobile, or a semiconductor device which may be effectively applied to electrical home appliances such as a TV, a DVD, and major appliances, which requires relatively high breakdown voltage and high drive performance.

What is claimed is:

1. A method of manufacturing a semiconductor device, comprising:
   forming, on a semiconductor substrate of a first conductivity type, a buried layer of a second conductivity type;

forming an epitaxial layer of the second conductivity type on the buried layer;
forming a body region of the first conductivity type at a certain depth from a surface of the epitaxial layer of the second conductivity type;
selectively lowering a surface of the body region to form a convex-type contact region which protrudes from the lowered surface of the body region and form a shallow trench around the convex-type contact region;
forming a deep trench region in the shallow trench so as to extend from a part of the lowered surface of the body region to inside of the epitaxial layer of the second conductivity type;
forming a gate insulating film on an inner wall of the deep trench region;
filling the deep trench region with polycrystalline silicon so that the polycrystalline silicon is held in contact with the gate insulating film;
forming a source region of the second conductivity type in the shallow trench in the surface of the body region;
forming a body contact region of the first conductivity type in the convex-type contact region on the surface of the body region; and
forming a silicide layer for connecting the source region and the body contact region to each other,
wherein the body contact region comprises an entire surface of the convex-type contact region, and the entire surface and a surface of the source region are covered with the silicide layer.

2. A method of manufacturing a semiconductor device according to claim 1, wherein the shallow trench has a depth in a range of 200 nm to 600 nm.

3. A method of manufacturing a semiconductor device according to claim 1, wherein the forming of the shallow trench comprises:
forming a LOCOS oxide film; and
removing a part of the LOCOS oxide film.

4. A method of manufacturing a semiconductor device according to claim 3, wherein the LOCOS oxide film has a thickness in a range of 50 nm to 150 nm.

5. A method of manufacturing a semiconductor device according to claim 1, wherein the convex-type contact region is made only from a silicon material.

6. A method of manufacturing a semiconductor device, comprising:
forming a buried layer of a second conductivity type on a semiconductor substrate of a first conductivity type;
forming an epitaxial layer of the second conductivity type on the buried layer;
forming a body region of the first conductivity type at a certain depth from a surface of the epitaxial layer;
removing part of a semiconductor material forming the surface of the body region so as to lower the surface of the body region and form a convex-type contact region protruding from the lowered surface of the body region and form a shallow trench around the convex-type contact region;
forming a deep trench region in the shallow trench so as to extend from a part of the lowered surface of the body region to inside of the epitaxial layer;
forming a gate insulating film on an inner wall of the deep trench region;
filling the deep trench region with polycrystalline silicon so that the polycrystalline silicon is held in contact with the gate insulating film;
forming a source region of the second conductivity type in the shallow trench;

forming a body contact region of the first conductivity type in the convex-type contact region; and
forming a silicide layer for connecting the source region and the body contact region to each other,
wherein the body contact region comprises an entire surface of the convex-type contact region, and the entire surface and a surface of the source region are covered with the silicide layer.

7. A method of manufacturing a semiconductor device according to claim 6, wherein the shallow trench has a depth in a range of 200 nm to 600 nm.

8. A method of manufacturing a semiconductor device according to claim 6, wherein the forming of the shallow trench comprises: forming a LOCOS oxide film; and removing a part of the LOCOS oxide film.

9. A method of manufacturing a semiconductor device according to claim 8, wherein the LOCOS oxide film has a thickness in a range of 50 nm to 150 nm.

10. A method of manufacturing a semiconductor device according to claim 6, wherein the convex-type contact region is made only from a silicon material.

11. A method of manufacturing a semiconductor device, comprising:
forming an epitaxial layer on a buried layer provided on a semiconductor substrate;
forming a body region in the epitaxial layer at a preselected depth from a surface of the epitaxial layer;
selectively lowering a surface of the body region to form a convex-type contact region protruding from the lowered surface of the body region and form a shallow trench around the convex-type contact region;
forming a deep trench region in the shallow trench so as to extend from a part of the lowered surface of the body region to inside of the epitaxial layer;
forming a gate insulating film on an inner wall of the deep trench region;
filling the deep trench region with polycrystalline silicon so that the polycrystalline silicon is held in contact with the gate insulating film;
forming a source region in the shallow trench;
forming a body contact region in the convex-type contact region; and
forming a silicide layer on the source region and the body contact region to connect the source region and the body contact region to one another.

12. A method of manufacturing a semiconductor device according to claim 11, wherein the shallow trench has a depth in a range of 200 nm to 600 nm.

13. A method of manufacturing a semiconductor device according to claim 11, wherein the forming of the shallow trench comprises: forming a LOCOS oxide film; and removing a part of the LOCOS oxide film.

14. A method of manufacturing a semiconductor device according to claim 13, wherein the LOCOS oxide film has a thickness in a range of 50 nm to 150 nm.

15. A method of manufacturing a semiconductor device according to claim 11, wherein the semiconductor substrate, the body region, and the body contact region have a first conductivity type; and wherein the buried layer, the epitaxial layer, and the source region have a second conductivity type different from the first conductivity type.

16. A method of manufacturing a semiconductor device according to claim 11, wherein the body contact region comprises an entire surface of the convex-type contact region.

17. A method of manufacturing a semiconductor device according to claim 16, wherein the silicide layer is formed so as to cover the entire surface of the convex-type contact region and a surface of the source region.

\* \* \* \* \*